(12) United States Patent
Yang et al.

(10) Patent No.: US 6,818,541 B2
(45) Date of Patent: Nov. 16, 2004

(54) METAL BONDING METHOD FOR SEMICONDUCTOR CIRCUIT COMPONENTS EMPLOYING PRESCRIBED FEEDS OF METAL BALLS

(75) Inventors: Cheng-Chieh Yang, Taipei (TW); Wen-Long Chen, Taipei (TW); Yao-Huang Tsai, Taipei (TW); Chih-Liang Hu, Taipei (TW); Pan-Nan Chen, Keelung (TW)

(73) Assignee: Comchip Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/249,572

(22) Filed: Apr. 21, 2003

(65) Prior Publication Data

US 2004/0185650 A1 Sep. 23, 2004

(30) Foreign Application Priority Data

Mar. 21, 2003 (TW) ........................................ 92106255 A

(51) Int. Cl.⁷ ............................................. H01L 21/44
(52) U.S. Cl. ........................ 438/612; 438/613; 438/615
(58) Field of Search ................................ 438/612–617; 228/111.5, 262.61, 262.51, 56.3

(56) References Cited

U.S. PATENT DOCUMENTS

| | | | | |
|---|---|---|---|---|
| 5,880,017 A | * | 3/1999 | Schwiebert et al. | 438/613 |
| 5,985,694 A | * | 11/1999 | Cho | 438/108 |
| 6,234,373 B1 | * | 5/2001 | Wark | 228/19 |
| 6,475,897 B1 | * | 11/2002 | Hosaka | 438/617 |

OTHER PUBLICATIONS

Brazing ans Soldering Alloys, N. MacQuesten Parkway, Mount Vernon, N. Y.*
Silvabrite 100 Product sheet from Engelhard, 1987.*

* cited by examiner

Primary Examiner—Ha Tran Nguyen
(74) Attorney, Agent, or Firm—Jiang Chyun IP Office

(57) ABSTRACT

A method for fabricating metal bonding for a semiconductor circuit component employing prescribed feed of metal ball is disclosed. The method comprises the steps of, first, placing a metal ball at the metallization site on the surface of the circuit die of the component; then, melting the metal ball on the site; and subsequently solidifying the molten metal and forming a metal bump at the site. A circuit die having formed with one or more metal bumps can then be made into a circuit component featuring stable and reliable electrical leads and suitable to be utilized as large power rating yet with reduced component size in electronic equipment.

9 Claims, 7 Drawing Sheets

METAL BONDING METHOD FOR SEMICONDUCTOR CIRCUIT COMPONENTS EMPLOYING PRESCRIBED FEEDS OF METAL BALLS

CROSS REFERENCE TO RELATED APPLICATIONS

This application claims the priority benefit of Taiwan application serial no. 92106255, filed Mar. 21, 2003.

BACKGROUND OF INVENTION

1. Field of the Invention

The present invention relates in general to semiconductor circuit components and a method of fabrication. In particular, the present invention relates to the fabrication of metal bonding for device dice of semiconductor circuit components utilizing prescribed feeds of metal balls.

2. Technical Background

Core circuit devices of semiconductor circuit components, either integrated or discrete, are fabricated on silicon wafers in batches of multiple dice. After the wafer fabrication stage, each circuit component die needs to be secured to and hermetically sealed in an enclosure, frequently plastic or ceramic, and becomes a useful circuit component for assembly onto the printed circuit board of an electronic equipment. An important step in this packaging process is bonding, the electrical connection of contact pads on the component die to their corresponding pins of the package.

Various types of electrical connection are used for different circuit components. For example, joining is a scheme connecting the die circuitry to the package relying on pure mechanically pressed contact. Joining is found primarily in discrete circuit components such as diodes that mechanically press the electrical contact of a circuit die onto its corresponding package lead. Joining is susceptible to fluctuations of environmental factors and is generally unreliable.

Another method of electrical connection between circuit dice and their package pins or leads popularly used in integrated circuits and some discrete components involves the bonding of both the device die and the die contact pads. The device die is fixedly secured to a substrate in the die-bonding process, while wire-bonding connects a length of wire of selected metal or alloy between the contact pads on the circuit die and their corresponding pins of the package. In the case of ICs, this wire-bonding facilitates the wired connection between contact pads distributed around the periphery of the IC die and their corresponding connection points on the lead-frame of the chip carrier (package). Although straightforward, however, die- and wire-bonding is relatively tedious, time-consuming and costly as mechanical maneuvering is necessary for each bonding.

Note that bonding provided by hardened metal grain-containing bonding pastes can not be considered metal bond. The resin-based material embedding the metal grains is susceptible to changes in environmental factors, temperature and humidity in particular. More, these conventional methods, die-/wire-bonding and similar inclusive, are not suitable for large-power applications such as power diodes.

Some prior-art components, power transistor and diodes in particular, require the stability and strong bond provided by metal bonding due to thermal stresses arising from their operation. However, conventional metal bonding has been relying on rare and expensive metals such as rhodium, molybdenum and platinum so that manufacturing costs are high.

SUMMARY OF INVENTION

It is therefore an object of the present invention to provide a method of fabricating metal bonding for semiconductor circuit components between die electrical contacts and package electrical leads that is reliable within the temperature ranges during both fabrication and operation of circuit components.

It is another object of the present invention to provide a method of fabricating reliable metal bonding for semiconductor circuit components at low costs.

In order to achieve the above and other objects, the present invention provides a method for the fabrication of metal bonding for a semiconductor circuit component employing prescribed feed of metal ball. The metal bonding fabrication method comprises the steps of, first, placing a metal ball at the metallization site on the surface of the circuit die of the component; then, melting the metal ball on the site; and subsequently solidifying the molten metal and forming a metal bump at the sit

BRIEF DESCRIPTION OF DRAWINGS

The above and other objects, features, and advantages of this invention will become apparent by way of the following detailed description of the preferred but non-limiting embodiments. The description is made with reference to the accompanying drawings in which.

DETAILED DESCRIPTION

The present invention discloses a method for fabricating metal bonding for semiconductor circuit components that employs prescribed feeds of metal balls, which allow for the manufacture of components having strong and stable metal bonds. Although discrete circuit components are used in the following descriptive paragraphs for the description of the present invention, the method of the present invention, however, is equally suitable for application to integrated circuits.

Also, the method of the present invention can be tightly combined with the semiconductor wafer fabrication stage of the manufacture of a circuit component. In other words, method procedural steps of the present invention can be adequately intermixed and integrated with the wafer fabrication of the target circuit dice. On the other hand, the method of the present invention can also be initiated after the fabrication of a wafer of the target circuit dice has generally been concluded. The method of the present invention then takes such a wafer as input for processing. Thus, the method of the present invention essentially does not interfere with the semiconductor fabrication processing. Rather, it can be considered as a succeeding processing that add to the target circuit component the valuable characteristics of metal bonding.

More, the metal described in the following embodiments of the present invention can be any metal or alloy suitable for the purpose of providing electrically conductive bonding between the circuit die and the electrical leads of its protective packaging. Preferred metals are those having a melting temperature sufficiently above the designed operating temperature and below the semiconductor fabrication processing temperature range of the target component.

Figure 1:
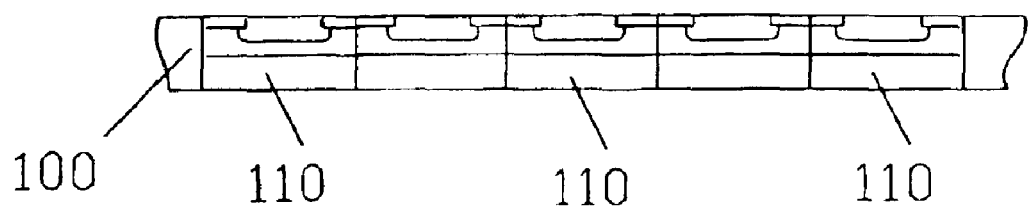
FIG. 1 is a cross-sectional view showing a semiconductor wafer for the manufacture of circuit components featuring metal bonding in accordance with a preferred embodiment of the present invention.

As indicated, discrete circuit components are used as examples for the description of the present invention. FIG. 1 illustrates a cross-sectional view showing a semiconductor wafer for the manufacture of circuit components featuring metal bonding in accordance with a preferred embodiment of the present invention. A section of a wafer 100 including a number of units of circuit dies 110 not yet physically separated is shown in the cross-sectional view. Note that details of the semiconductor structural configuration of each die 110 (which may, for example, be a diode) are not elaborated in the drawing as they are not the subject matter of the present invention.

Figure 2:
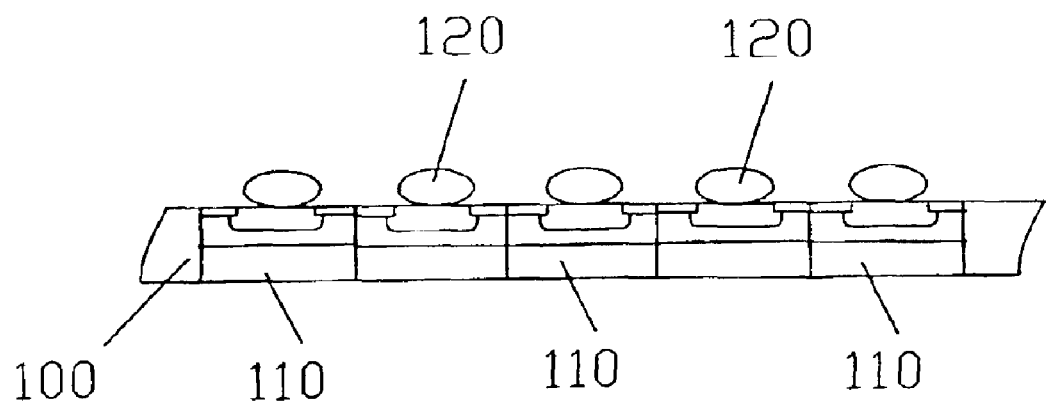
FIG. 2 is a cross-sectional view showing the placement of one feed of bonding metal on the surface of each unit of circuit die of the wafer.

Top surface of each die 110 in FIG. 1 has a metallization surface area ready to accept the placement of one feed of metal ball 120 as is shown in FIG. 2. Before the placement of the feeds 120, the location of ball placement for each unit die 110 can be prepared with a coating of bonding flux via, for example, a screen-printing process. This assists in the temporary secured attachment of each of the placed feeds of metal balls 120 before melted to inflict a true metal bonding between the feed of metal 120 and the metallization surface of the die 110. The coated flux itself can also assists in the metal bonding.

It should also be mentioned that the gross placement of an entire matrix of feed balls over the surface of a wafer such as illustrated in FIG. 2 is achievable via mechanical manipulations involving, for example, the shaking of the balls after they are poured thereon. Although not detailed in FIGS. 1 and 2, the top surface of each of the dice where a metal feed ball is to be placed, selective surface characteristics of the wafer assists in achieving the placement of one and only one ball for each die.

Figure 3:
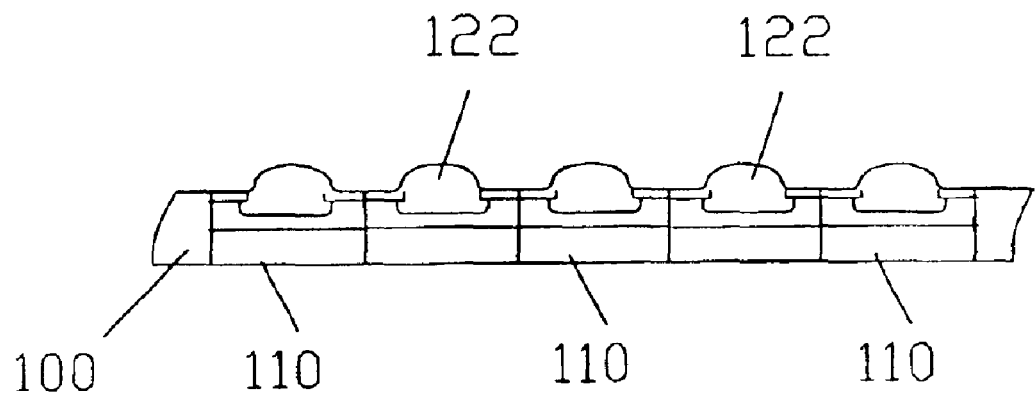
FIG. 3 is a cross-sectional view showing the melt-bonding of each metal ball feed of FIG. 2 onto the surface of the corresponding unit of circuit die of the wafer.

Then, the wafer 100 of FIG. 2, together with its placement of matrix of metal feed balls 120, can be subject to a thermal processing scheme that melts all the balls on-site their respective placement location, as is illustrated in FIG. 3. The thermal processing to melt the feed balls may, for example, be a thermal reflow. In the drawing, the cross-sectional view shows the melt-bonding of each metal ball feed of FIG. 2 results into a metal bump 122 on top the surface of the corresponding unit of circuit die 110 of the wafer 100. Note that the size of the bump 122 can be easily controllable by selecting the size of the balls 120. Also, shapes of all the bumps 122 for the entire matrix can be within a high degree of uniformity.

As mentioned, the metal or alloy selected for the balls 120 has a melting temperature sufficiently above the designed operating temperature range and below the semiconductor fabrication processing temperature range of the target component.

Figure 4:
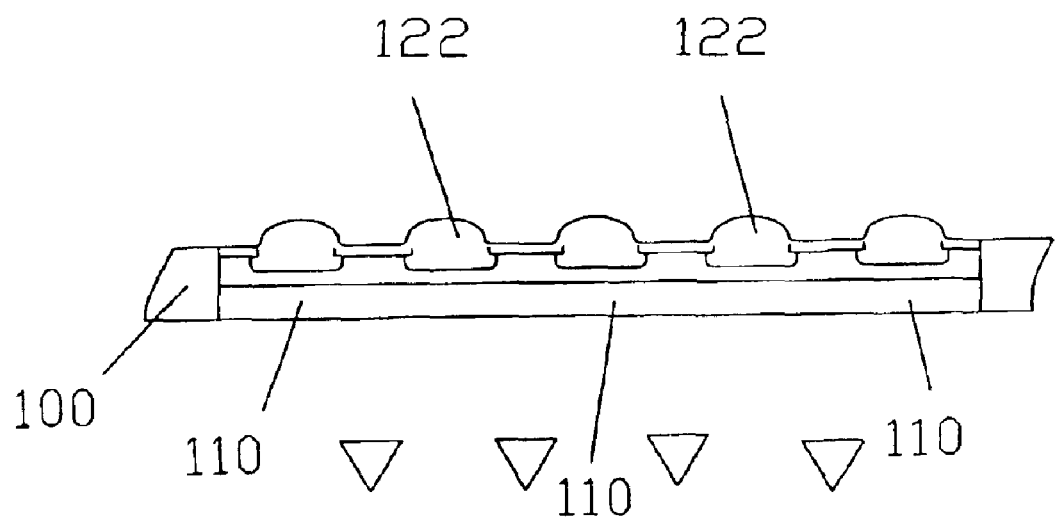
FIG. 4 is a cross-sectional view illustrating the separation of the circuit dice from the gross wafer of FIG. 3.

After the formation of the metal bumps 122 in FIG. 3, the wafer 100 of FIG. 3 can then be submitted for a cutting procedure that physically separates all individual dice from the gross wafer, as is illustrated in FIG. 4. FIG. 4 is a cross-sectional view illustrating the locations of separation of the circuit dice from the gross wafer of FIG. 3. The result of this separation is illustrated in FIG. 5 as individual single-bump dice 112.

Figure 5:
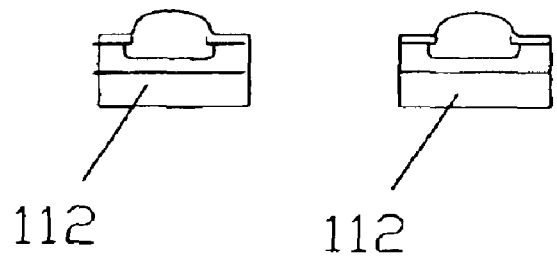
FIG. 5 is a cross-sectional view illustrating the individual circuit dice formed as a result of the separation implemented in FIG. 4.

If the design of a circuit component requires that the die has one single metal bump, the individual dice as cut from the wafer and shown in FIG. 5 can then be sent for the packaging procedural steps, and the metal-bonding processing of the present invention concludes. The post processing of the circuit dices eventually results into complete circuit components equipped with stable and reliable metal bonding.

Figure 6:
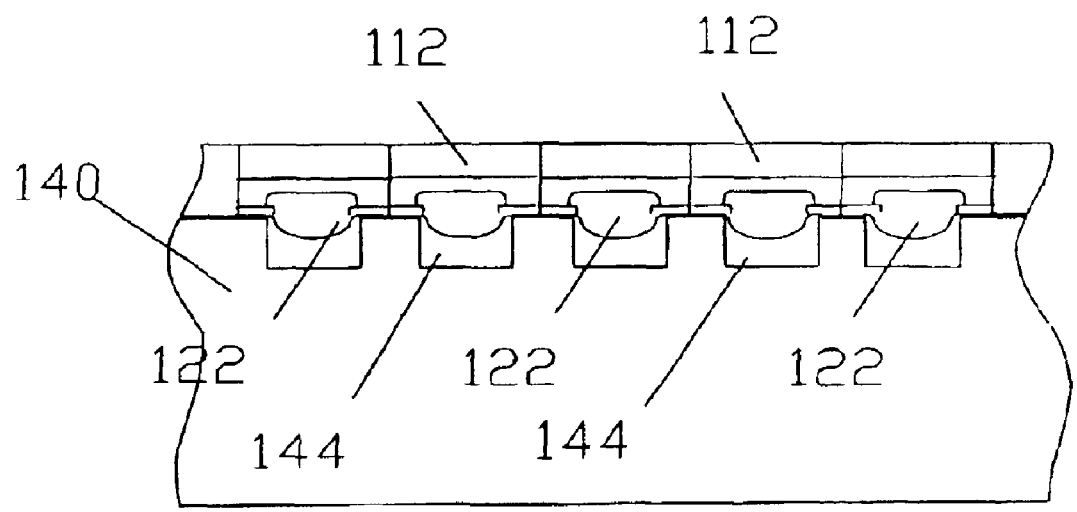
FIG. 6 is a cross-sectional view illustrating the placement of one circuit die with a metal bump formed to one surface thereof into one corresponding recessed space formed over the surface of a fixture.

If, however, each of the target circuit dice needs two or more metal bumps, the processing of the present invention continues from FIG. 3 as illustrated in FIG. 6. FIG. 6 is a cross-sectional view illustrating the placement of one circuit die with a metal bump formed to one surface thereof into one corresponding recessed space formed over the surface of a fixture. As is illustrated in the cross-sectional view, the fixture 140 provides an entire array of spaces 144, each of which can be used to accommodate one circuit die 112. A plain view of the fixture can be seen in FIG. 7 to be described below.

As is illustrated, each of the circuit die 112 falling into its corresponding space 144 in the fixture 140 has its metal bump 122 facing downward.

Figure 7:
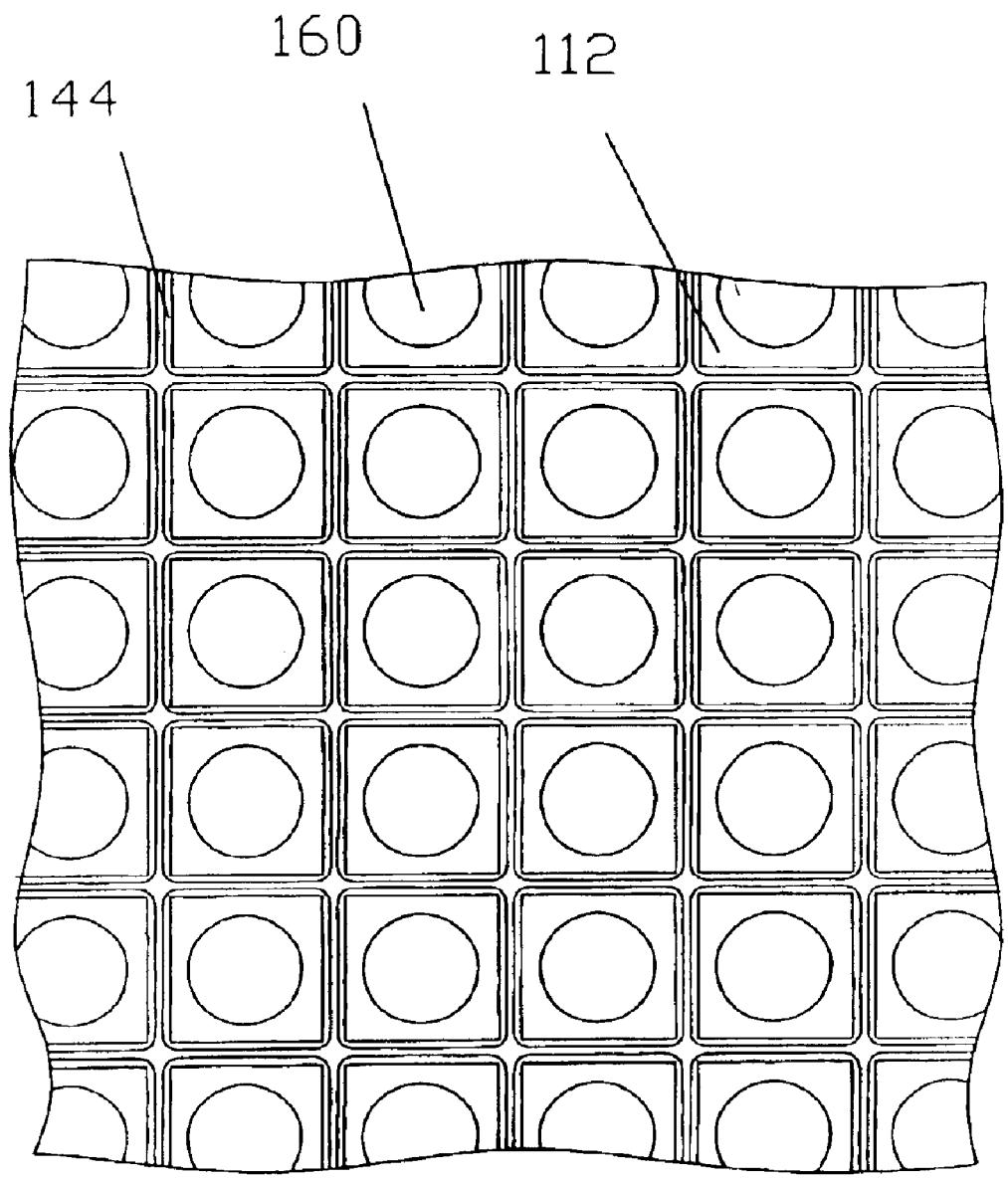
FIG. 7 is a top view illustrating the placement of one feed of bonding metal on the surface of each unit of circuit die as settled in the corresponding recessed space thereof.

The second metal bump can then be formed for each of the circuit die already placed in its corresponding space within the fixture, as is illustrated in FIG. 7. FIG. 7 is a top view illustrating the placement of one feed of bonding metal on the surface of each unit of circuit die settled in the corresponding space thereof. One and only one metal feed ball 160 is placed on the designated site over the surface of a circuit die 112. As is shown, each of the dice 112 is in turn placed within its space 144 of the fixture 140.

Figure 8:
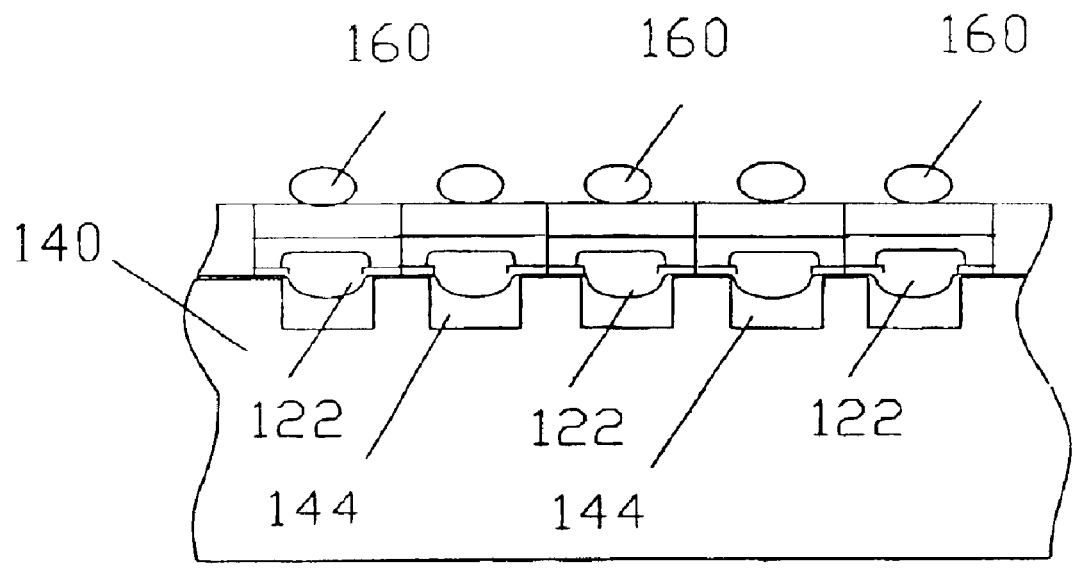
FIG. 8 is a cross-sectional view illustrating the orderly placement of one feed of bonding metal ball onto the surface of one circuit die placed in the recessed space of the fixture.

FIG. 8 is a cross-sectional view illustrating the orderly placement of one feed of bonding metal ball onto the surface of one circuit die placed in the corresponding space of the fixture. Top surface of the die 112, similar to that described above for the formation of the first metal bump, can also assist in the aligned placement of the feed ball onto the die.

Figure 9:
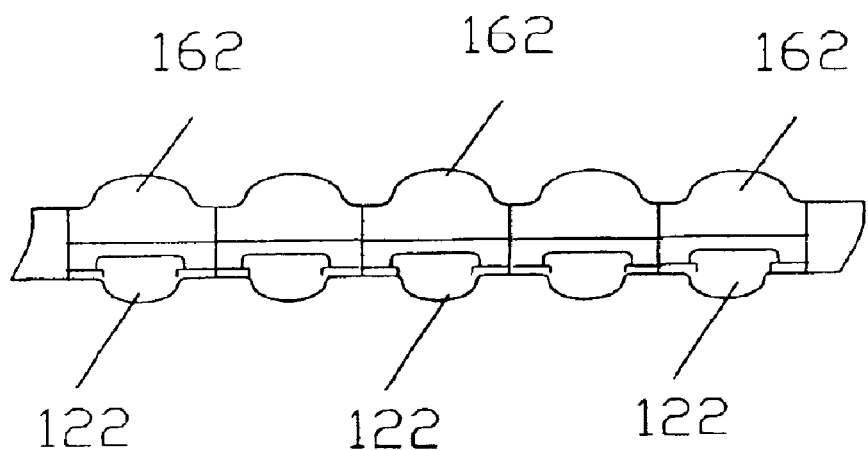
FIG. 9 is a cross-sectional view illustrating the melt-bonding of each metal ball feed of FIG. 8 onto the surface of the corresponding unit circuit die placed in the corresponding recessed space of the fixture.

A thermal processing scheme, a thermal reflow for example, then follows to melt each of the placed metal feed balls. FIG. 9 is a cross-sectional view illustrating the melt-bonding of each metal ball feed of FIG. 8 onto the surface of the corresponding unit circuit die. Result of the thermal processing is a second metal bump 162 for each of the processed dice 112.

Note that the size and shape of this second metal bump 162 for each die 112 can be different from its first bump 122, as is illustrated in FIG. 9. Again, the size of this second bump 162 is also controllable via adjustment of the second metal feed balls 160, it is also equally applicable that if the second bump is required to be of the same size as that of the first. Shape of the bumps among all dice would also be uniform.

Shape and size of the metal bumps are controllable via selection of the size, weight and/or material of the metal ball feeds. Such control can be advantageous in the fabrication of certain discrete components such as, for example, diodes and transistors. For example, P/N polarities of a batch of diodes fabricated can be easily aligned in uniformity by arranging different size and or weight of the respective metal bumps formed on the opposite surfaces of each of the device die.

Figure 10:
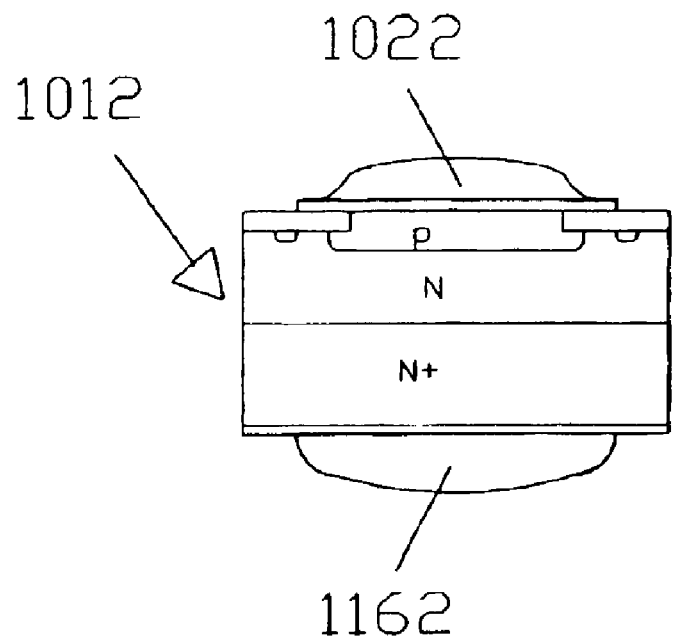
FIG. 10 is a cross-sectional view illustrating the formation of one metal bump on each of the two opposite surfaces of a diode with a planar P/N junction after physically separated into one individual die.
Figure 11:
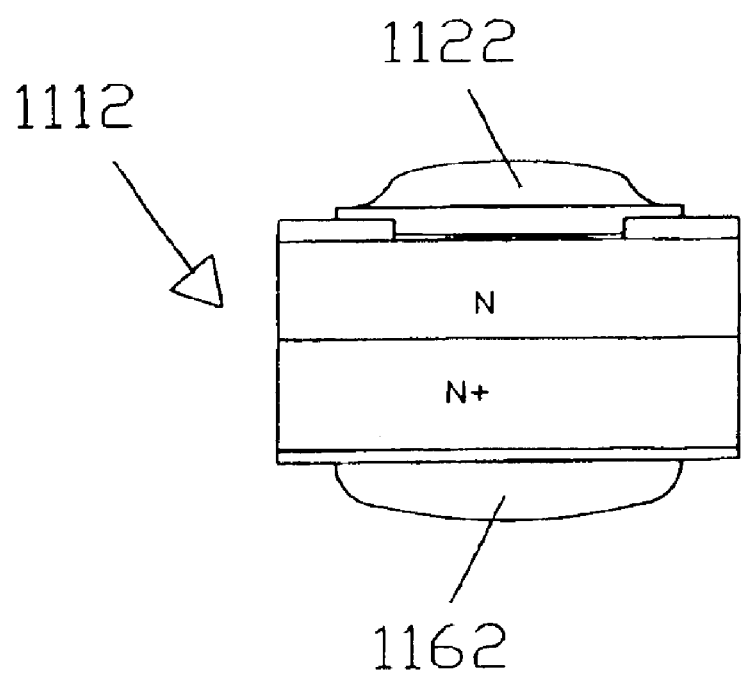
FIG. 11 is a cross-sectional view illustrating the formation of one metal bump on each of the two opposite surfaces of a diode with a planar P/N junction after physically separated into one individual die.
Figure 12:
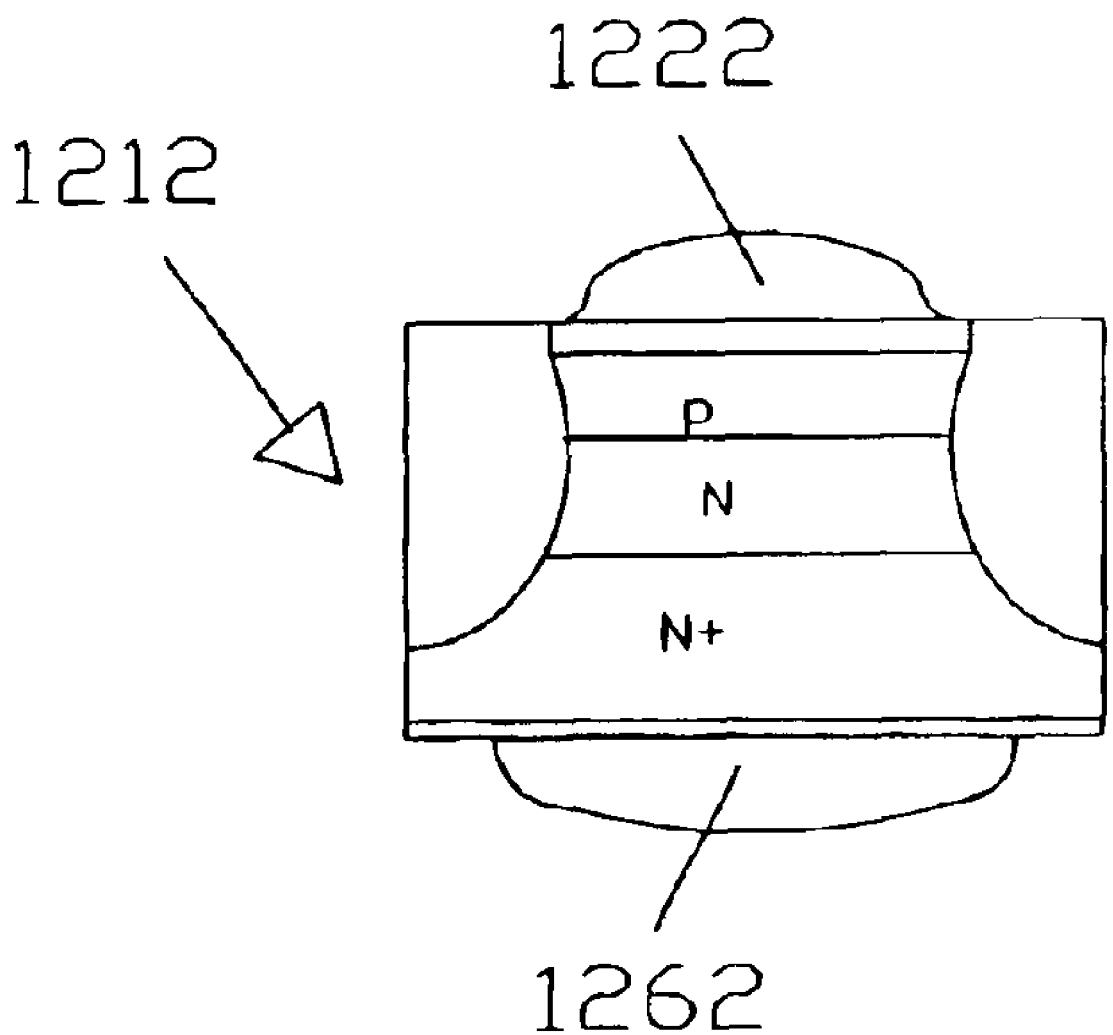
FIG. 12 is a cross-sectional view illustrating the formation of one metal bump on each of the two opposite surfaces of a diode with a mesa P/N junction after physically separated into one individual die.

FIGS. 10, 11 and 12 respectively depicts the cross-section view of dice of three types of diode made with metal bumps in accordance with the present invention that can be used to form metal bonding in their respective packaging. FIG. 10 is a cross-sectional view illustrating the formation of one metal bump, 1022 and 1062 respectively, on each of the two opposite surfaces of a diode 1012 with a planar P/N junction after physically separated into one individual die. FIG. 11 is a cross-sectional view illustrating the formation of one metal bump, 1122 and 1162 respectively, on each of the two opposite surfaces of a diode 1112 with a planar P/N junction after physically separated into one individual die. And, FIG. 12 is a cross-sectional view illustrating the formation of one metal bump, 1222 and 1262 respectively, on each of the two opposite surfaces of a diode 1212 with a mesa P/N junction after physically separated into one individual die.

The above descriptive paragraphs, together with the accompanying drawings, describe a general method for the fabrication of metal bonding of a semiconductor circuit component employing prescribed feed of metal ball. An inventive method in accordance with the teaching of the present invention thus comprises the steps of, first, placing a metal ball at the metallization site on the surface of the circuit die of the component; then, melting the metal ball on the site; and subsequently solidifying the molten metal and forming a metal bump at the site.

As is comprehensible, different metallic material such as, copper, aluminum, tin and lead and the their alloy are applicable for use in a process of the present invention for forming metallic bumps.

Metal bonding is a more reliable method of die-package electrical connection than others. Metal bonds are stable and therefore secure within the typical operating temperature range (about 200 to 700 degree Celsius) of semiconductor components. On the other hand, the temperature range for the formation of metal bonds is normally well below the temperatures for typical semiconductor fabrication processing. Thus, metal bonding processing steps implemented after the fabrication of circuit die is concluded in a semiconductor facility is advantageous. This is because the metal-bonding processing does not damage the die due to the fact that the thermal-based processing temperature range for metal bonding is typically well below that for the die fabrication. Further, since only thermal processing is required without the involvement of any acid and/or base treatments, the metal bonding in accordance with the teaching of the present invention has little, if any at all, effect on the quality of the circuit die obviously more environmental-friendly.

While the above is a full description of the specific embodiments of the present invention, various modifications, alternative constructions and equivalents may be used. Therefore, the above description and illustrations should not be taken as limiting the scope of the present invention which is defined by the appended claims.

What is claimed is:

1. A method of fabricating metal bonding for a semiconductor circuit component employing prescribed feed of metal balls, said method comprising the steps of:

a) providing a power semiconductor circuit component having a circuit die with at least two metallization sites that are disposed opposite to each other and respectively on two opposite surfaces of said circuit die and placing a metal ball at each of said metallization sites on the surface of the circuit die of said power semiconductor circuit component;

b) melting said metal ball on said metallization site; and c) solidifying said molten metal ball and forming a metal bump at each of said metallization sites, wherein said metal bumps provide stable and secure circuit paths for processing rated electrical power throughout an operating temperature range of said power semiconductor circuit component.

2. The method of fabricating metal bonding for a semiconductor component of claim 1, wherein said metal ball contains copper.

3. The method of fabricating metal bonding for a semiconductor component of claim 1, wherein said metal ball contains aluminum.

4. The method of fabricating metal bonding for a semiconductor component of claim 1, wherein said metal ball contains tin.

5. The method of fabricating metal bonding for a semiconductor component of claim 1, wherein said metal ball contains lead.

6. The method of fabricating metal bonding for a semiconductor component of claim 1, wherein said at least two metal bumps on the two opposite surfaces are formed sequentially.

7. The method of fabricating metal bonding for a semiconductor component of claim 6, wherein said at least two metal bumps on the two opposite surfaces are of different sizes.

8. The method of fabricating metal bonding for a semiconductor component of claim 6, wherein said at least two metal bumps on the two opposite surfaces are of different shapes.

9. The method of fabricating metal bonding for a semiconductor component of claim 6, wherein said at least two metal bumps on the two opposite surfaces are made of different materials.

* * * * *